(12) United States Patent
Chhabra (10) Patent No.: US 8,381,049 B2
(45) Date of Patent: Feb. 19, 2013

(54) APPARATUS AND METHOD FOR TESTING SHADOW LOGIC

(75) Inventor: Amit Chhabra, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 324 days.

(21) Appl. No.: 12/814,664

(22) Filed: Jun. 14, 2010

(65) Prior Publication Data

US 2011/0271156 A1 Nov. 3, 2011

(30) Foreign Application Priority Data

Apr. 30, 2010 (IN) .............................. 1033/DEL/2010

(51) Int. Cl.
*G11C 29/00* (2006.01)
*G01R 31/28* (2006.01)

(52) U.S. Cl. ........................................ 714/718; 714/738
(58) Field of Classification Search ................. 714/718, 714/726, 724, 738
See application file for complete search history.

(56) References Cited

U.S. PATENT DOCUMENTS 7,441,164 B2 * 10/2008 Guettaf .......................... 714/718
7,913,138 B2 * 3/2011 Sawamura ..................... 714/731

* cited by examiner

*Primary Examiner* — James C Kerveros
(74) *Attorney, Agent, or Firm* — Hogan Lovells US LLP (57) ABSTRACT

A system for testing faults in shadow logic includes a sequential block coupled to a shadow logic block and a delaying block to receive test patterns for testing the shadow logic block. The delaying block delays the test patterns by an access time of the sequential block to generate delayed test patterns. The delayed test patterns are passed to the shadow logic block for testing faults.

20 Claims, 6 Drawing Sheets

APPARATUS AND METHOD FOR TESTING SHADOW LOGIC

RELATED APPLICATION

The present application claims priority of India Patent Application No. 1033/DEL/2010 filed Apr. 30, 2010, which is incorporated herein in its entirety by this reference.

FIELD OF THE INVENTION

The present invention relates to testing of memories in integrated circuit (IC) chips. More particularly, the subject matter of the present invention relates to the testing of a shadow logic of a memory in an IC chip.

BACKGROUND

With the current advancement in technology, integrated circuit (IC) chips have become increasingly complex and achieve a high level of integration. Today, IC chips may include a wide range of components like processor, memory, timers, counters, etc., as their functional modules. Testing of IC chips for their proper functioning has become challenging with their increasing complexity.

Testing IC chips involves testing of two areas, namely sequential blocks and their accompanying shadow logic. Sequential blocks, such as a memory block and a phase locked loop, perform essential functions of the IC chip while the shadow logic includes surrounding components, such as gates and logic circuits, which are needed for interfacing the sequential blocks with external circuits.

A shadow logic, for example, a shadow logic accompanying a memory block, can be tested for faults by writing test patterns on the memory block and then reading the test patterns through the shadow logic. The read test patterns can be analyzed with the help of a tester. The faults present in the memory block or in the shadow logic can be identified. Testing of faults in the shadow logic becomes particularly difficult because, as the name suggests, the shadow logic is in "shadow" of the memory block and, therefore, there is no direct path from the tester to the shadow logic. This makes it difficult to identify the source of faults in IC chips.

SUMMARY

This summary is provided to introduce concepts related to testing of a shadow logic of a memory, which are further described below in the detailed description. This summary is not intended to identify essential features of the claimed subject matter nor is it intended for use in determining or limiting the scope of the claimed subject matter.

Systems and methods for testing a shadow logic are described. In one implementation, control signals to bypass a sequential block of an IC chip are received. In addition, one or more test patterns are received. Once received, the test patterns are delayed by a time interval based on an access time of the sequential block. The delayed test patterns are then passed to the shadow logic for testing faults. The delayed test patterns, after passing through the shadow logic, are analyzed by a tester for faults, if any, present in the shadow logic.

In an implementation, when the sequential block is a memory, the test patterns can be delayed by using reference cells and reference row decoders of the memory.

These and other features, aspects, and advantages of the present subject matter will be better understood with reference to the following description and appended claims. This summary is provided to introduce a selection of concepts. This summary is not intended to identify key features or essential features of the claimed subject matter, nor is it intended to be used for to limiting the scope of the claimed subject matter.

BRIEF DESCRIPTION OF THE DRAWINGS

The detailed description is provided with reference to the accompanying figures. In the figures, the left-most digit(s) of a reference number identifies the figure in which the reference number first appears. The same numbers are used throughout the drawings to reference like features and components. For simplicity and clarity of illustration, elements in the figures are not necessarily to scale.

DETAILED DESCRIPTION OF PREFERRED EMBODIMENTS

Presently, the IC chips used in electronics devices, such as computers, laptops, mobile phones, and set-top boxes, include a sequential block surrounded by an accompanying logic, referred to as shadow logic. Examples of a sequential block may include, but are not limited to, a memory block for providing storage capabilities.

The sequential block is surrounded by the shadow logic for interfacing the memory with external circuits. Exchange of data signals between the memory and the external circuits takes place through the memory block and the shadow logic. For example, to read data from the memory block, control signals, such as a read enable signal, and address signals are sent to the memory block. The data read from the sequential memory block is then passed as data signals to external circuits through the shadow logic.

In some cases, the memory block or the shadow logic may suffer from fabrication defects and functional and environmental stress, such as stuck-at faults, transition faults, etc. In such cases, transition faults are manifested as delays in the data signals being exchanged between the memory and the external circuits. These delays may be caused by the memory block, the shadow logic, or both. If a delay in exchanging the data signals is greater than maximum allowable limit, it can lead to incorrect read or write operation at rated speed. Therefore, testing methods are designed to identify faults and ensure proper functioning of the memories.

A memory can be tested by writing known test patterns onto a memory block of the memory and then reading the test patterns through the shadow logic. A difference in the written and the read test patterns indicates the presence of a fault such as stuck-at faults or transition faults in the memory. The shadow logic, on the other hand, is conventionally tested by bypassing the memory block and providing the test patterns directly to the shadow logic to identify the faults. The bypassing is performed as the state of the shadow logic is dependant on the state of memory block. Hence, the number of test patterns required for testing would depend on the state of the memory block, thus reducing test efficiency. In the bypass mode, as the test patterns are not written on or read from the memory block, power consumption is reduced in addition to increased test efficiency.

However, bypassing the memory block will not be effective for testing the presence of transition faults in the shadow logic. This is because the shadow logic is directly accessed for testing in the bypass mode, the propagation delay and the time taken by the memory block is overlooked. For the testing of transition faults, the time taken by the test patterns to pass from the memory, which includes the memory block and the shadow logic, to a tester should be within an allowable limit at the rated speed. If the time taken by the test patterns is within the allowable limit, the memory is faultless. However, if this time exceeds the allowable limit, then either the memory block or the shadow block is faulty.

Thus, to test transition faults in the shadow logic, the time taken by the test patterns to pass the memory block should be correctly reproduced. If the time taken by the test patterns exceeds the allowable limit, then this extra delay can be inferred to have been caused by faults in the shadow logic, thereby allowing effective testing of the shadow logic.

The time taken by the memory block can be reproduced by using a functional path of the memory block. Test patterns can be written on the memory block and then read through the shadow logic. However, writing and then reading the test patterns costs power and is time consuming. In addition, the time taken by the test patterns to pass through the functional path may vary. Depending on a memory cell in the functional path through which the test patterns pass, the time taken may be different. The test results in such a case may be unreliable. Moreover, the test results will be incorrect in case faults are present in the memory block.

Systems and methods for testing of a shadow logic are described. To this end, test patterns for testing faults in a shadow logic are delayed by a time period equivalent to an access time of a memory block. The delayed test patterns are then provided to the shadow logic without accessing the memory block.

The presence of transition faults in the shadow logic is indicated if the time taken by the delayed test patterns to pass from the shadow logic combined with the time period of delay caused by the shadow logic exceeds an allowable time limit. The test patterns can be delayed by using delaying circuit elements, such as inverters and other logic gates. The shadow logic can thus be tested for various faults including the transition faults.

In an implementation, circuits implementing reference cells and a reference row decoder of the memory block are used to delay the test patterns. The reference cells and the reference row decoder generate an activation signal for a sensing unit, such as a sense amplifier. Also, the time taken by the sensing unit is reproduced by using delay elements, such as logic gates and sequential elements. The test patterns are provided to the shadow logic after the access time of the memory block without going through the cycles of reading and writing onto the memory block. The shadow logic can thus be effectively tested for transition faults based on the test patterns, with a considerable reduction in power.

Although the present subject matter has been explained with reference to the testing of a memory and its accompanying shadow logic, it can be used for testing any combinatorial logic hidden behind a complex sequential block, such as a phase locked loop (PLL). While aspects of described systems and methods for the testing of shadow logic in a memory can be implemented in any number of different computing systems, environments, and/or configurations, the embodiments are described in the context of the following exemplary system architecture(s). The descriptions and details of well-known components are omitted for simplicity of the description. Although the devices are explained herein as certain N-channel and P-channel devices, it can be appreciated that complementary devices are also possible in accordance with the present subject matter. Accordingly, the logic level of control signals can either be active low or active high.

Exemplary systems for practicing the present invention are now described.

Figure 1:
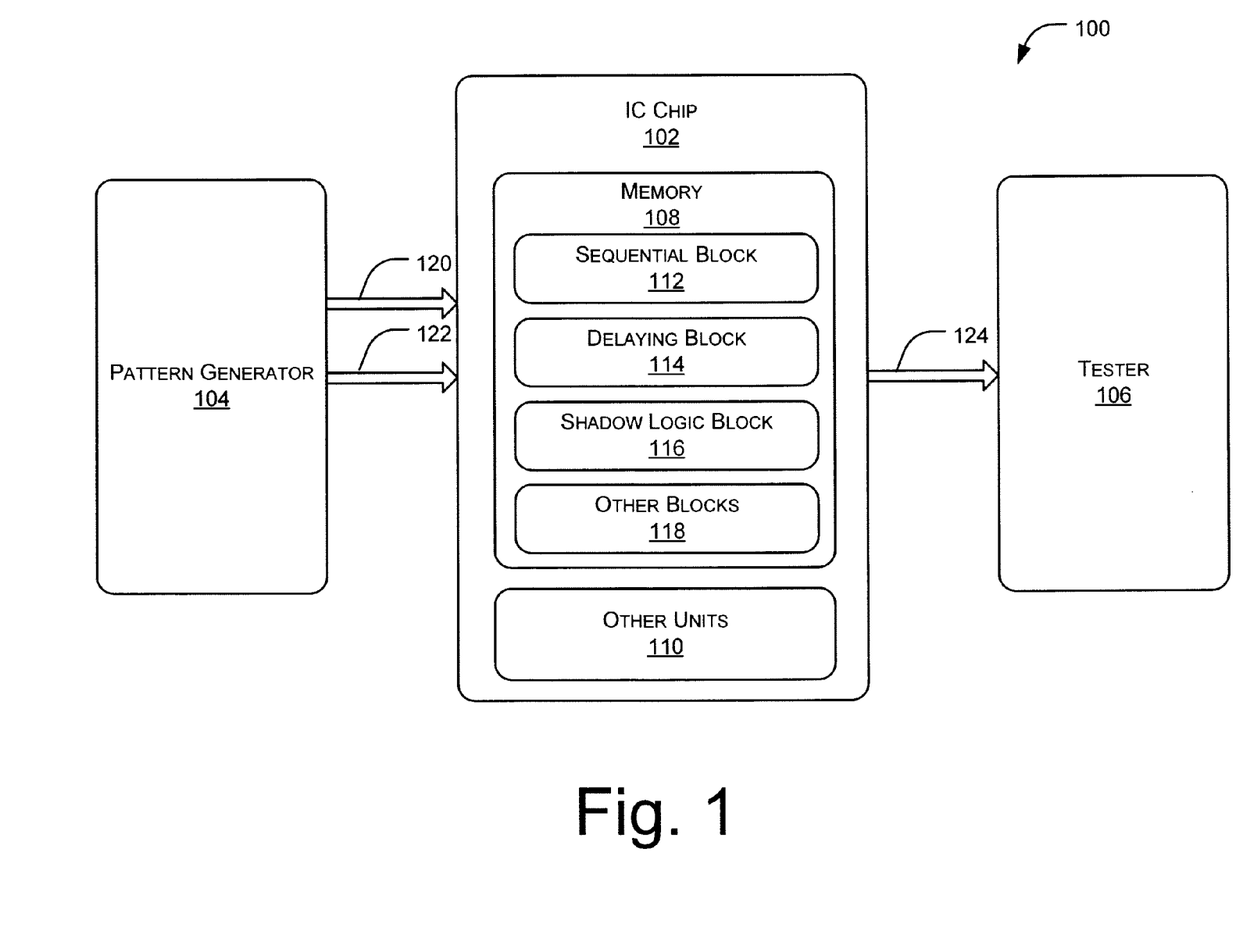
FIG. 1 illustrates an exemplary system for testing a shadow logic of a memory, in accordance with an embodiment of the present subject matter.

FIG. 1 illustrates an exemplary system 100 to test a shadow logic, according to an embodiment of the present subject matter. The system 100 includes an integrated circuit (IC) chip 102 coupled to a pattern generator 104 for testing faults present in the shadow logic of the IC chip 102. Test patterns after passing through the IC chip 102 are analyzed by a tester 106 for faults. The tester 106 can identify various types of faults, for example stuck-at faults and transition faults. The pattern generator 104 can be any standard pattern generator, for example, an automatic test pattern generator (ATPG), known in the art. The IC chip 102 may be implemented in various electronic devices such as a computer, a mobile phone, a set-top box, a laptop, and a server.

In an implementation, the IC chip 102 includes a memory 108 and other units 110. The other units 110 may include components such as a processor, a wireless processor, a digital signal processor, and a communication device for carrying out various functions of the IC chip 102. The memory 108, on the other hand, may include modules corresponding to one or more applications that are performed by the IC chip 102. In one implementation, the modules included in the memory 108 can be implemented as a plurality of logic and/or circuit elements. The memory 108 can be any memory known in the art, for example a flash memory, a Dynamic Random Access Memory (DRAM), etc. The memory 108 further includes a sequential memory block 112, a delaying block 114, a shadow logic block 116, other blocks 118 for storing data.

The delaying block 114 is configured for matching the test patterns with an access time of the sequential block 112. For that purpose, the delaying block 114 may include one or more delay elements, such as inverters, and other combinatorial elements. Further, data stored in the sequential block 112 or data to be written on the sequential block 112 is accessed or written through the shadow logic block 116. The shadow logic block 116 may include one or more logic gates or combinatorial circuits that interfaces the sequential block 112 to external circuits, for example the other units 110. The other blocks 118 may include delay elements, multiplexers, etc.

In operation, the pattern generator 104 generates test patterns 120 for testing the shadow logic block 116. The test patterns 120 are directly provided to the shadow logic block 116 by bypassing the sequential block 112. For testing the transition faults, for example, the total time taken by the test patterns 120 to traverse the memory 108 and reach the tester 106 should be within an allowable limit for reliable operation at a rated speed. The allowable limit, as mentioned previously, is equivalent to the time taken for a signal to traverse, from the sequential block 112 to an external circuit via the shadow logic block 116, say when data is read from the sequential block 112.

Thus, to effectively test the shadow logic block 116 for faults while bypassing the sequential block 112, the access time of the sequential block 112 is reproduced. If the shadow logic block 116 is faultless, the time taken by the test patterns 120 to traverse through the shadow logic block 116, when combined with the reproduced access time of the sequential block 112, will be within the allowable limit. However, more time taken by the test patterns 120 to pass through the shadow logic block 116 indicates the presence of transition faults, among other faults, in the shadow logic block 116.

In one implementation, the test patterns 120 can be generated upon instantiation of a mode, such as a bypass mode. The bypass mode can be indicated by a bypass mode signal 122 from the pattern generator 104. The test patterns 120 are delayed based on the access time of the sequential block 112 using the delaying block 114. For testing, the sequential block 112 of the memory 108 is bypassed, and the delayed test patterns from the delaying block 114 are passed to the shadow logic block 116. The delayed test patterns subsequent to passing through the shadow logic block 116 are analyzed by the tester 106 for detecting faults in the shadow logic block 116. As the sequential block 112 is not accessed for testing the shadow logic block 116, power consumption and complexity of the testing is considerably reduced.

Although the shadow logic block 116 has been shown as a part of the memory 108, it should be noted that any other combinatorial logic that is a 'shadow' of a sequential circuit can also be tested using a similar methodology. The references to various blocks of the memory 108 has been used for illustration purpose only. It should not be construed, in any way, as a limitation of the present subject matter.

Figure 2:
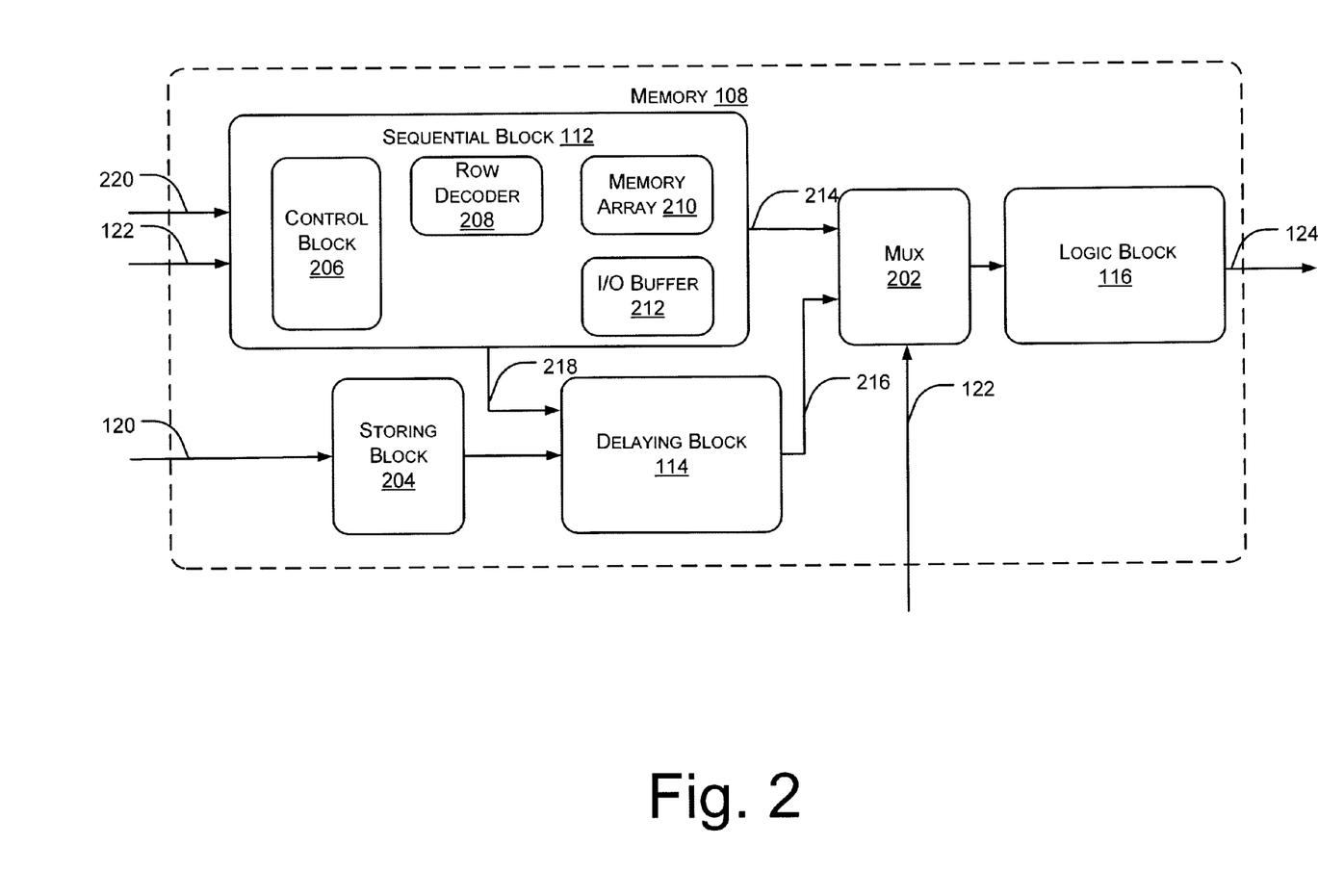
FIG. 2 illustrates an exemplary configuration of a memory for testing shadow logic, in accordance with an embodiment of the present subject matter.

FIG. 2 illustrates a block diagram of the memory 108 for testing the shadow logic block 116, in accordance with an embodiment of the present subject matter.

The sequential block 112 in the memory 108 is configured to interface with the delaying block 114 and a MUX 202. The MUX 202, in turn, interfaces the delaying block 114 and the shadow logic block 116. The MUX 202 is also configured to receive data signals, test patterns, and the bypass mode signal 122. The MUX 202 can be implemented using a multiplexer circuit commonly known in the art. Further, the delaying block 114 interfaces a storing block 204 configured to store the test patterns, for example, the test patterns 120 received from the pattern generator 104, for testing the shadow logic block 116. The storing block 204 can be implemented using one or more flip-flops or any other sequential elements or their combination, known in the art.

In an implementation, the sequential block 112 includes a control block 206 for controlling exchange of data signals passing through the sequential block 112. The sequential block 112 further includes a row decoder 208, a memory array 210, and an input/output (I/O) buffer 212. The row decoder 208 is configured for selecting one or more address locations, such as locations represented as word lines, in the memory array 210. The I/O buffer 212 is configured for exchanging data signals between the memory array 210 and external circuits, such as the other units 110.

In an implementation, the I/O buffer 212 includes circuits for reading data from and writing data onto the memory array 210. For reading data from the sequential block 112, the I/O buffer 212 may include a sense amplifier, while for writing data, the I/O buffer 212 includes write drivers and other write circuits commonly known in the art.

In one implementation, the memory 108 is configured to operate in two modes, namely the normal mode and the bypass mode. In the normal mode or a functional mode, data signals 214 are exchanged between the memory 108 and the external circuits or the other units 110 of the IC chip 102. The data signals 214 are passed from the sequential block 112 to the shadow logic block 116 through the MUX 202.

In the bypass mode, the test patterns 120 are passed from the storing block 204 to the delaying block 114. The delaying block 114 delays the test patterns 120 and provides delayed test patterns 216 to the shadow logic block 116 through the MUX 202. The delayed test patterns 216, after passing through the shadow logic block 116, are analyzed by the tester 106 for faults present in the shadow logic block 116.

In an implementation, the control block 206 receives the bypass mode signal 122 and control signals 220. The control block 206 detects the mode of operation of the memory 108 based on the bypass mode signal 122. For example, when the bypass mode signal 122 is at logic LOW, the memory 108 operates in the normal mode, while a logic HIGH indicates the bypass mode for testing the shadow logic block 116 in the memory 108. The control signals 220, as mentioned previously, may be used for performing read or write operations onto the memory array 210. In an implementation, the control signals 220 may include an address signal, a read enable signal, and a clock signal for the operations of the sequential block 112.

The address signal specified in the control signals 220 indicates an address location in the memory array 210. The address location as specified by the control signals 220 is accessed through the row decoder 208. Depending on the value of the read enable signal included in the control signals 220, data can be read from the memory array 210. In one implementation, the read or write operations can be synchronized based on the clock signal.

The sequential block 112 generates an activation signal 218 in both the normal mode and the bypass mode. For example, in the normal mode, when reading data from a memory cell in the memory array 210, the control block 206 receives an address signal for the memory cell and a read enable signal as specified in the control signals 220. Once provided with the address signal, the row decoder 208 selects a word line of the memory array 210 corresponding to the memory cell.

A bit line pair of the memory array 210 corresponding to the memory cell is also activated to send data signals to the I/O buffer 212. The I/O buffer 212 senses the value of the data signals based on the activation signal 218. The activation signal 218 can be generated based on one or more delaying elements included in the memory. The delay elements may include, but are not limited to, inverters, transistors, and amplifiers. In one implementation, the activation signal 218 is generated with the help of reference row decoders and reference memory cells present in the row decoder 208 and the memory array 210, respectively.

The reference row decoders and the reference memory cells ensure that there is a uniform access time for reading data from any memory cell of the memory array 210. This access time is a combination of the time taken by a memory cell within the memory array 210 to discharge through its bit line pair, and the time taken by the I/O buffer 212 to sense the memory cell. As is known in the art, the sensing involves reading the memory cell for a '0' or a '1' stored in the cell.

As it is very difficult to ensure a uniform discharge time of all the memory cells, the sensing of the bit line pairs is performed based on the activation signal 218. By using discharging time of the reference memory cells to generate the activation signal 218, a uniform access time is achieved for all the memory cells of the memory array 210. It will be understood that there might be small delays in the form of the time taken by the I/O buffer 212 to sense data from different memory cells.

In the bypass mode, the delaying block 114 receives the test patterns 120 from the storing block 204 and the activation signal 218 from the sequential block 112. The activation signal 218, as mentioned above, simulates a uniform access time for reading data from the memory array 210. Based on the activation signal 218 received from the sequential block 112, the delaying block 114 simulates the delayed test patterns 216 based on the time taken by the I/O buffer 212 of the sequential block 112. Thus, the delaying block 114 effectively delays the test patterns 120 by a time equivalent to the access time of the sequential block 112 to generate the delayed test patterns 216.

Once generated, the delayed test patterns 216 are provided to the MUX 202, which based on the bypass mode signal 122, passes the delayed test patterns 216 to the shadow logic block 116. The delayed test patterns 216, when passed through the shadow logic block 116, provides an indication that the shadow logic block 116 is faulty or not. For example, if the time taken by the delayed test patterns 216 to pass through the shadow logic block 116 combined to the time of the delay exceeds the allowable limit, the shadow logic block 116 is faulty.

Figure 3A:
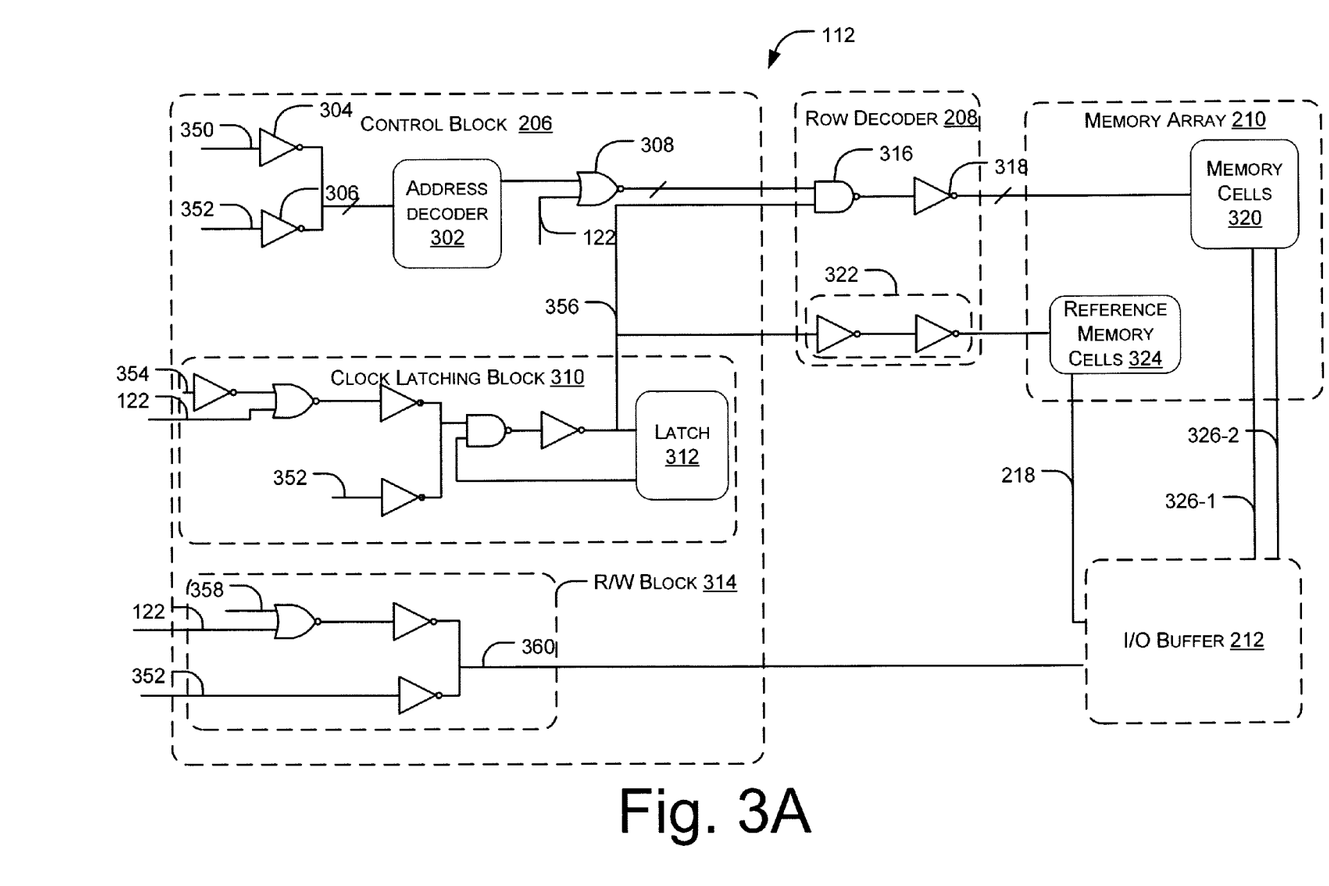
FIG. 3A illustrates an exemplary circuit of a sequential block to generate an activation signal for testing shadow logic, in accordance with an embodiment of the present subject matter.

FIG. 3A illustrates the sequential block 112 for generating the activation signal 218, in accordance with an embodiment of the present subject matter. The control block 206 of the sequential block 112 includes an address decoder 302 that receives the address signals corresponding to one or more memory cells within the memory array 210. In an implementation, the address decoder 302 receives address signals 350 and scan input signals 352 through inverters 304 and 306, respectively. The scan input signals 352 help in improving the controllability and observability of the components of the memory 108. The address decoder 302 is coupled to the row decoder 208 through a NOR logic gate 308.

The control block 206 also includes a clock latching block 310 for enabling the sequential block 112 for reading or writing operations. The clock latching block 310 receives a chip select signal 354 to generate an internal clock signal 356. The generated internal clock signal 356 is passed to the row decoder 208 and other components of the sequential block 112. The clock latching block 310 also receives the bypass mode signal 122 and the scan input signals 352. In an implementation, the clock latching block 310 generates the internal clock signal 356 using a combination of logic gates and a latch 312, as shown in FIG. 3A. However, any other combinatorial circuit, as will be appreciated by a person skilled in the art, can also be used for generating the internal clock signal 356.

The control block 206 further includes a read/write (R/W) block 314 for controlling read/write operations associated with the memory array 210. The R/W block 314 receives a write enable signal 358 to generate an internal write enable signal 360. The internal write enable signal 360 facilitates read/write operation of the sequential block 112. In an implementation, the internal write enable signal 360 is generated by the R/W block 314 using a combination of logic gates, as shown in FIG. 3A.

The R/W block 314 also receives the scan input signals 352 along with the bypass mode signal 122 for reading from or writing data onto the memory array 210. The memory array 210 is coupled to the row decoder 208 for accessing word lines. The row decoder 208 may include one or more AND gates and inverters for accessing a word line corresponding to memory cells 320 of the memory array 210. For illustration purposes, a single AND gate 316 and an inverter 318 are shown for accessing one word line. Similarly, multiple AND gates and inverter logic gates can be used for accessing a plurality of word lines.

The row decoder 208 also includes a reference row decoder 322 coupled to reference memory cells 324 of the memory array 210. The reference row decoder 322 can be implemented using a combination of logic gates, as shown in FIG. 3A. The reference memory cells 324 can be formed from a combination of one or more memory cells placed in a one or more columns, one or more rows, or any combination thereof.

The reference memory cells 324 and the memory cells 320 are coupled to the I/O buffer 212. The reference memory cells 324 are coupled to provide the activation signal 218 to the I/O buffer 212. The memory cells 320 are coupled to the I/O buffer 212 through a plurality of bit line pairs. For illustration purpose, a single bit line pair 326 is depicted in FIG. 3A. The bit line pair 328 includes a bit line 326-1 and a bit line bar 326-2.

For a read operation, during the normal mode of operation, the control block 206 receives the address signals 350 and provides them to the row decoder 208. The address signals 350 are provided to the row decoder 208, along with the bypass mode signal 122, through the NOR logic gate 308. The row decoder 208 also receives the internal clock signal 356 from the clock latching block 310. Based on these signals, the row decoder 208 selects a word line and a bit line pair, for example, the bit line pair 326, from the memory cells 320. Data signals from one of the memory cells 320 are passed through the bit line pair 326 to the I/O buffer 212.

Simultaneously, the reference decoder 322 and the reference memory cells 324 generate the activation signal 218 based on the internal clock signal 356 from the clock latching block 310. The activation signal 218 is provided to the I/O buffer 212. The data signals on the bit line pair 326 are then read from the R/W block 314 and the activation signal 218 based on the internal write enable signal 360.

During the bypass mode, the bypass mode signal 122 deactivates the row decoder 208 through the NOR logic gate 308. The reference row decoder 322 and the reference memory cells 324 remain active and generate the activation signal 218. The R/W block 314 is configured in the read mode through the bypass mode signal 122.

Figure 3B:
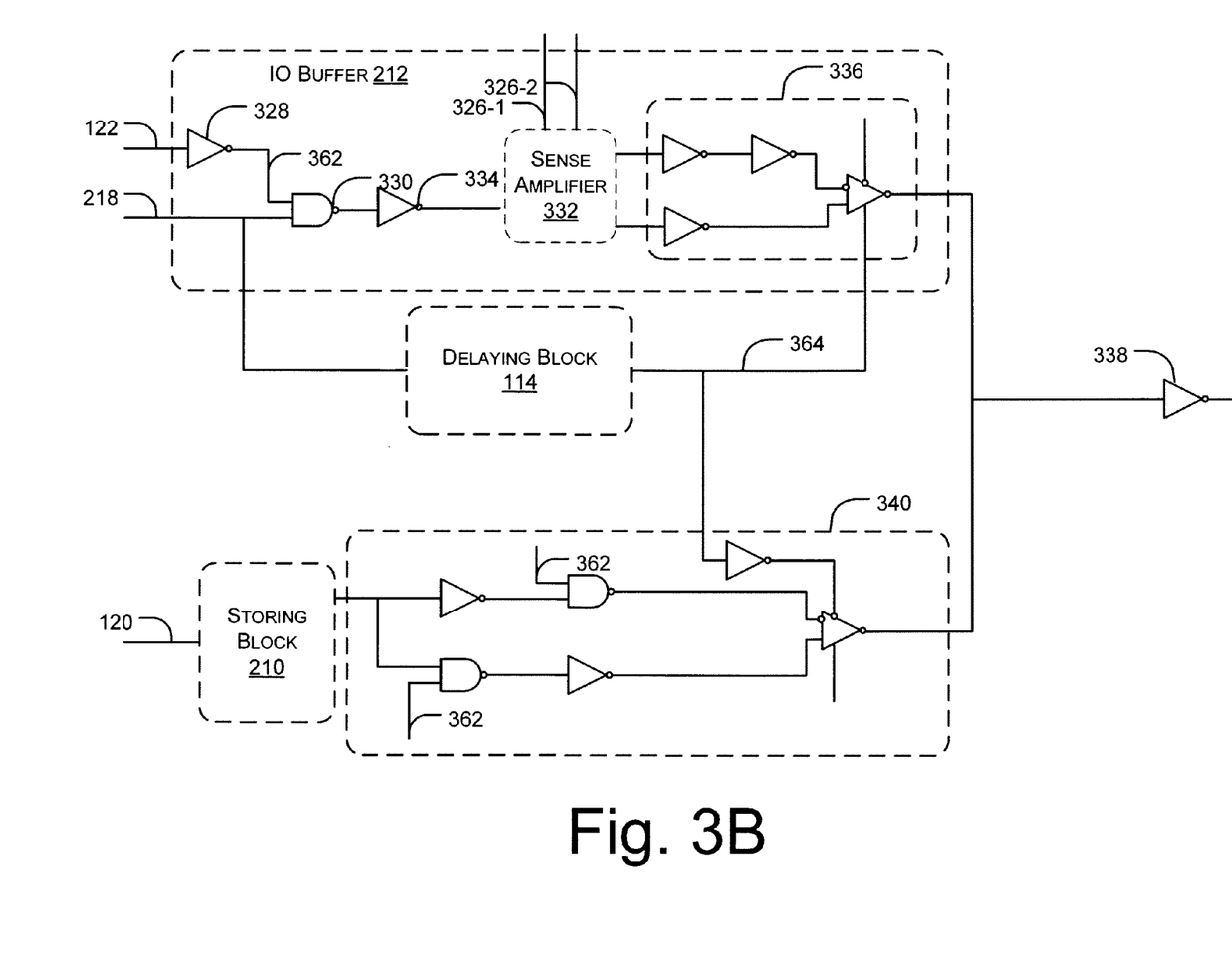
FIG. 3B illustrates an exemplary circuit of the sequential block of FIG. 2 for testing the shadow logic block, in accordance with an embodiment of the present subject matter.

FIG. 3B illustrates components of the sequential block 112 for testing the shadow logic block 116, in accordance with an embodiment of the present subject matter. The I/O buffer 212 of the sequential block 112 receives the bypass mode signal 122, say through an inverter 328. The complement of the bypass mode signal 122 is indicated as a complement bypass mode signal 362. The bypass mode signal 122 is coupled with the activation signal 218 through an AND logic gate 330. The AND logic gate 330 is coupled to a sense amplifier 332 through an inverter 334. The sense amplifier 332 is configured to read data from the memory cells 320 through the bit line pairs, for example, the bit line pair 326. The sense amplifier 332 is coupled to the shadow logic block 116 (not shown in the figure) through a plurality of combinatorial circuit elements 336 and an inverter 338, as shown in FIG. 3B.

The shadow logic block 116 is also coupled to the storing block 204 through a plurality of combinatorial circuit elements 340 and the inverter 338, as shown in FIG. 3B. The combinatorial circuit elements 340 also couples the delaying block 114 to the storing block 204. The delaying block 114 simulates the access time of the sense amplifier 332 for sensing the data signals from the bit line pair 326. In one implementation, the delaying block 114 also simulates the small delays caused in the sensing of data from different memory cells. The delaying block 114 simulates the worst case access time of the sense amplifier 332 for sensing the data signals.

In the normal mode, the I/O buffer 212 receives the activation signal 218 from the reference decoder 322 and the reference memory cells 324, as described above. The activation signal 218, in combination with the bypass mode signal 122, activates the sense amplifier 332 through the AND logic gate 330 and the inverter 334. The sense amplifier 332 receives the data signals from the bit line pair 326. Based on the activation signal 218, the data signals are sensed and data indicating a '0' or a '1' is passed to the combinatorial circuit elements 336. The combinatorial circuit elements 336 also receive a data ready signal 364 from the delaying block 114. The data ready signal 364 indicates when the data can be passed from the combinatorial circuit elements, such as the combinatorial circuit elements 336 and 340, to the shadow logic block 116 through the inverter 338.

For testing, during the bypass mode, the bypass mode signal 122 deactivates the sense amplifier 332 through the AND logic gate 330 and the inverter 334. Thus, the data signals from the bit line pair 326 are not sensed by the sense amplifier 332. The storing block 204 receives the test patterns 120 for testing the shadow logic block 116. The test patterns 120 are passed on to the combinatorial circuit elements 340. The combinatorial circuit elements pass the test patterns 120 to the shadow logic block 116 through the inverter 338. The passing on of the test patterns 120 is based on the data ready signal 364 from the delaying block 114. In an implementation, the delaying block 114 simulates the access time of the sense amplifier 332 based on the activation signal 218. Thus, the time taken to transfer the test patterns 120 from the storing block 204 to the shadow logic block 116 is about the same as the time taken during transferring the data from the I/O buffer 212 to the shadow logic block 116.

Figure 4:
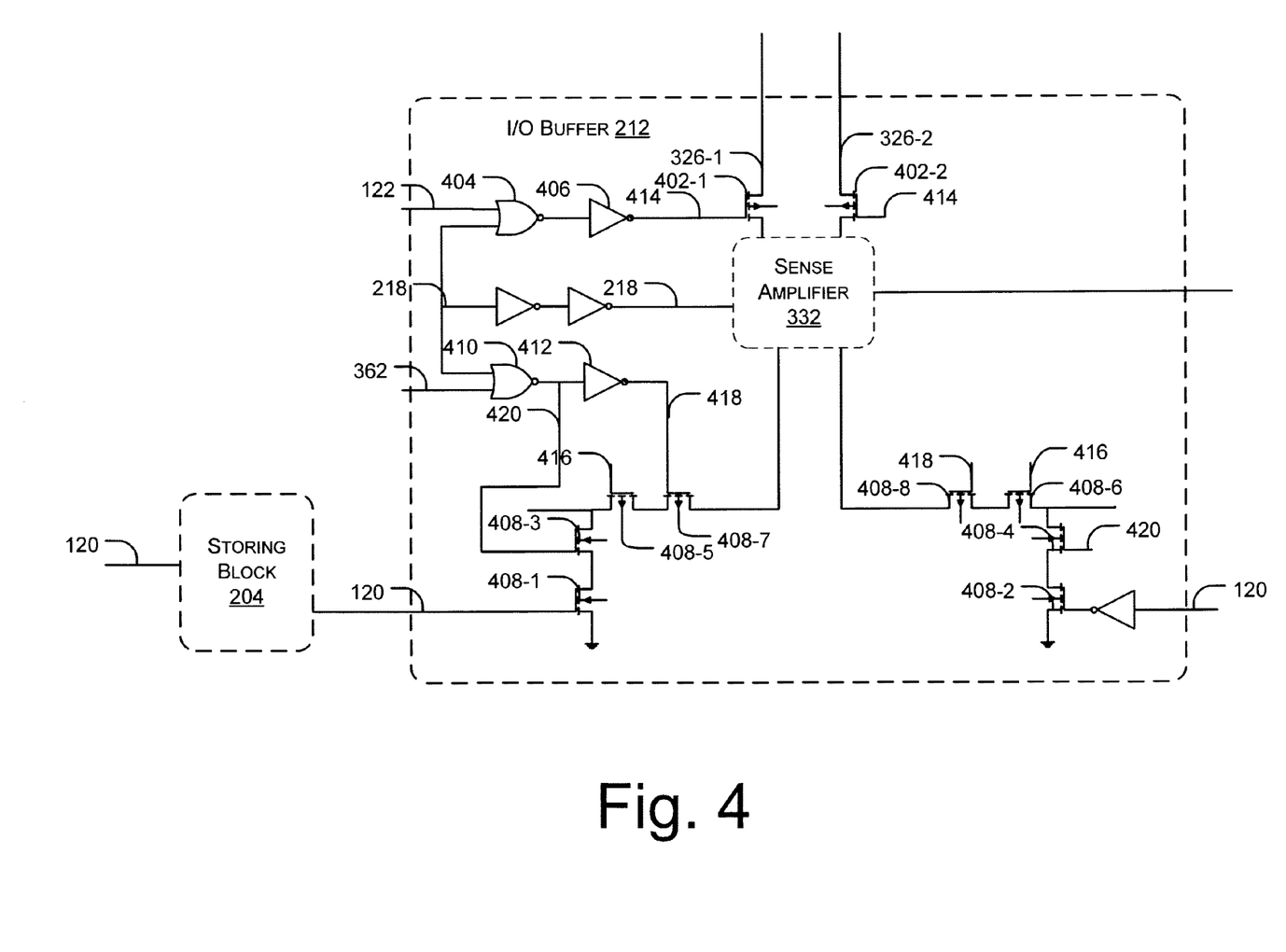
FIG. 4 illustrates components of the memory for testing the shadow logic, in accordance with another embodiment of the present subject matter.

FIG. 4 illustrates various components of the memory 108 for testing the shadow logic, in accordance with an embodiment of the present subject matter. In said embodiment, the sequential block 112 is modified to perform the functioning of the delaying block 114.

For that purpose, the bit line pair 326 from the memory array 210 is coupled to the sense amplifier 332 through a pair of transistors 402-1 and 402-2, collectively referred to as transistors 402. The transistors 402 are configured to receive at their gate terminals, a first pass gate signal 414. The first pass gate signal 414 is generated based on the bypass mode signal 122 and the activation signal 218. In an implementation, the bypass mode signal 122 and the activation signal 218 are received through a NOR logic gate 404 and an inverter 406. In said implementation, the transistors 402 are P-channel Metal Oxide Semiconductor (P-MOS) transistors. However, usage of any other transistors or switches by persons skilled in the art is also within the scope of the present subject matter.

The I/O buffer 212 may also include a plurality of transistors 408-1, 408-2, . . . , 408-8 to couple the storing block 204 to the sense amplifier 332. The transistors 408-1 and 408-2 respectively receive the test patterns 120 and complements of the test patterns 120 at their gate terminals. The transistors 408-3 and 408-4 receive at their gate terminals, a combination of the activation signal 218 and the complement of the bypass mode signal 122, through a NOR logic gate 410. The transistors 408-5 and 408-6 receive a pre-charging signal 416, while the transistors 408-7 and 408-8 receive a second pass gate signal 418. In an implementation, the pre-charging signal 416 is used to pre-charge the transistors 408 used for coupling the sense amplifier 332 with the storing block 204. In another implementation, the pre-charging signal 416 can be obtained from a pre-charge signal of a sense amplifier. The second pass gate signal 418 may be based on the complement of the bypass mode signal 362 and the activation signal 218 received through the NOR logic gate 410 and an inverter 412.

In operation, during the normal mode, the pair of transistors 402-1 and 402-2 are turned ON based on the first pass gate signal 414. The data signals from the bit line pair 326 is passed to the sense amplifier 332 through the transistors 402. The sense amplifier 332 receives the activation signal 218 for sensing the data signals received from the bit line pair 326. The sensed data signals are then passed to the shadow logic block 116. The test patterns 120 from the storing block 204 to the sense amplifier 332 are decoupled as the transistors 408 are turned OFF, based on the second pass gate signal 418.

During the bypass mode, the transistors 408-7 and 408-8 are turned ON by the second pass gate signal 418. The test patterns 120 from the storing block 204 are coupled to the sense amplifier 332 through the transistors 408 and are passed on to the shadow logic block 116 (not shown in the figure) for testing. It will be understood that the data signals from the bit line pair 326 to the sense amplifier 332 are decoupled during the bypass mode based on the first pass gate signal 414. By using elements of the I/O buffer 212, the access time of the I/O buffer 212 and thus, of the sequential block 112, is simulated.

Figure 5:
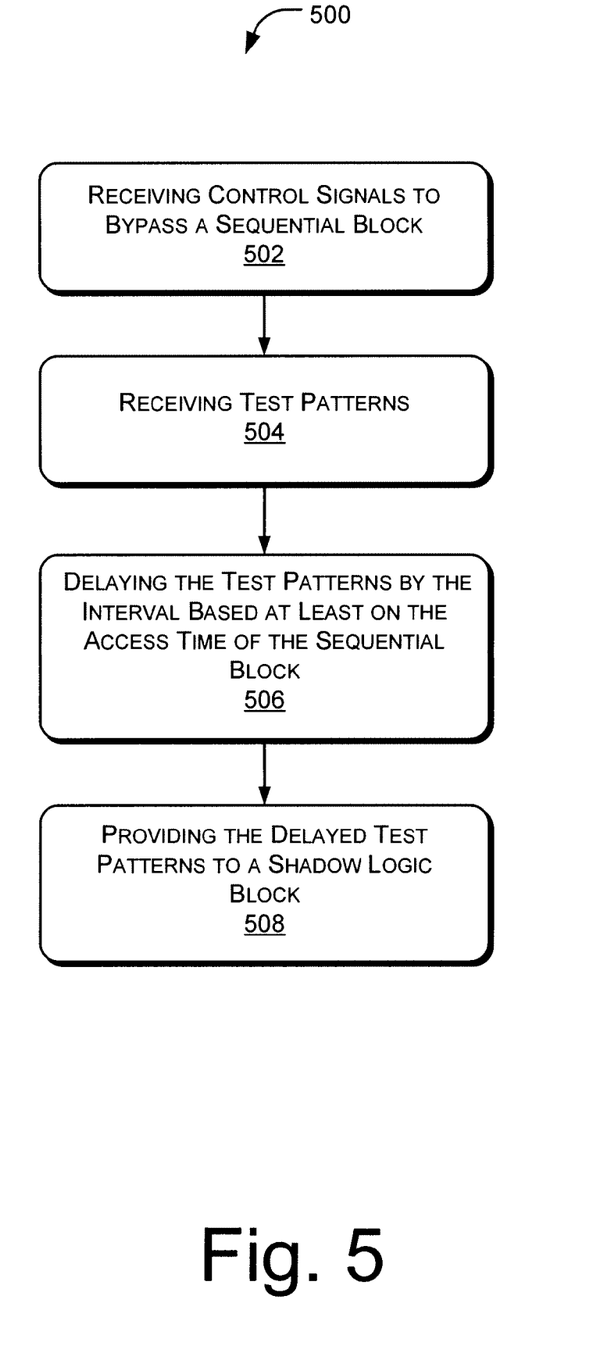
FIG. 5 illustrates an exemplary method for testing of a shadow logic of a memory, in accordance with an embodiment of the present subject matter.

FIG. 5 illustrates an exemplary method for testing shadow logic block accompanying a sequential block, in an embodiment of the present subject matter. The method may be described in the general context of sequential components, for example, a memory, a phase-locked loop, etc.

The order in which the method is described is not intended to be construed as a limitation, and any number of the described method blocks can be combined in any order to implement the method, or an alternative method. Additionally, individual blocks may be deleted from the method without departing from the spirit and scope of the subject matter described herein.

At block 502, control signals, such as a bypass signal and a read enable signal, are received to bypass a sequential block. The sequential block can be any sequential element in an IC chip. For example, the bypass mode signal 122 bypasses the sequential block 112 of the memory 108 in the bypass mode. In one implementation, the bypass mode signal 122 is received by the control block 206 of the sequential block 112.

At block 504, test patterns are received for testing of the shadow logic block. The test patterns can be received from a test pattern generator, for example, an ATPG. In an implementation, the test patterns 120 are received by the storing block 204 of the memory 108.

At block 506, the test patterns are delayed by a time equivalent to an access time of the sequential block. For a testing faults in the shadow logic, the total time taken by the test patterns to traverse from the sequential block and the shadow logic block should be within the allowable limit. As the sequential block is bypassed, the access time of the sequential block needs to be simulated for effective testing. The access time can be simulated by partially using the path of the sequential block. In an implementation, in the memory 108, the reference row decoders 322 and the reference memory cells 324 generate the activation signal 218, which is used by the delaying block 114 to delay the test patterns. The activation signal 218 simulates the time taken by the sequential block 112 to discharge the bit line pairs, while the delaying block 114 simulates the time taken by the I/O buffer 212 to sense the data signals in the bit line pairs.

At block 508, the delayed test patterns are fed to the shadow logic block for their testing. For example, the MUX 202 provides the delayed test patterns 216 to the shadow logic block 116 during the bypass mode. The presence of transition faults in the shadow logic is indicated if the time taken by the delayed test patterns to pass the shadow logic combined with the time period of delay exceeds the allowable limit. The shadow logic block is generally placed after the sequential block.

Although embodiments for testing of shadow logic have been described in language specific to structural features and/or methods, it is to be understood that the invention is not necessarily limited to the specific features or methods described. Rather, the specific features and methods are disclosed as exemplary embodiments for testing of the shadow logic.

I claim:

1. An integrated circuit (IC) chip comprising:
   a shadow logic block;
   a sequential block, wherein the sequential block interfaces with a plurality of external circuits through the shadow logic block; and
   a delaying block associated with the sequential block, wherein the delaying block is configured to delay a plurality of test patterns based at least in part on an access time of the sequential block and to provide the delayed test patterns to the shadow logic block for testing, and wherein the sequential block generates an activation signal that is received by the delaying block.

2. The IC chip as claimed in claim 1, wherein the delaying block operates upon instantiation of a bypass mode.

3. The IC chip as claimed in claim 1, wherein the sequential block is a part of a memory.

4. The IC chip as claimed in claim 3, wherein the sequential block generates the activation signal based at least on delaying elements included in the memory.

5. The IC chip as claimed in claim 4, wherein the delaying elements include a reference row decoder and a plurality of reference memory cells.

6. The IC chip as claimed in claim 4, wherein the delaying block delays the plurality of test patterns based on the activation signal.

7. The IC chip as claimed in claim 3, wherein the delaying block includes a plurality of delaying elements to simulate the time taken by a sensing unit of the memory in a functional mode.

8. The IC chip as claimed in claim 3, wherein the delaying block includes a plurality of delaying elements to simulate small delay defects in reading data from the memory.

9. The IC chip as claimed in claim 3, wherein the delaying block is a sensing unit of the memory configured to read data from the memory.

10. The IC chip as claimed in claim 1, wherein the plurality of test patterns are received from a pattern generator.

11. The IC chip as claimed in claim 1, further comprising a MUX configured to:
    receive a plurality of data signals from the sequential block and the delayed test patterns from the delaying block; and
    transmit the received plurality of data signals and the delayed test patterns to the shadow logic block.

12. A method for testing a shadow logic block, the method comprising:
    receiving a plurality of test patterns;
    delaying the plurality of test patterns based at least on an access time of a sequential block; and
    passing the delayed test patterns to the shadow logic block by bypassing the sequential block.

13. The method as claimed in claim 12, wherein the delaying is performed upon instantiation of a bypass mode.

14. The method as claimed in claim 12, further comprising passing the delayed test patterns to a tester to identify faults.

15. The method as claimed in claim 12, wherein the delaying is based on a plurality of reference memory cells and on a reference row decoder of the sequential block.

16. The method as claimed in claim 15, further comprising simulating time taken by a sensing unit of the sequential block.

17. The method as claimed in claim 12 performed by a single integrated circuit.

18. A method for testing shadow logic in a memory, the method comprising:
    receiving a plurality of test patterns;
    generating an activation signal for facilitating uniform access time of the memory; and
    generating delayed test patterns by delaying, based at least on the activation signal, the plurality of test patterns.

19. The method as claimed in claim 18, further comprising passing the delayed test patterns to the shadow logic.

20. The method as claimed in claim 18 performed by a single integrated circuit.

* * * * *